United States Patent
Zhao et al.

(10) Patent No.: US 11,681,332 B2
(45) Date of Patent: Jun. 20, 2023

(54) DISPLAY PANEL AND METHOD FOR MANUFACTURING THE SAME

(71) Applicant: KunShan Go-Visionox Opto-Electronics Co., Ltd., Jiangsu (CN)

(72) Inventors: Ying Zhao, Kunshan (CN); Weili Li, Kunshan (CN); Mingxing Liu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 0 days.

(21) Appl. No.: 17/580,026

(22) Filed: Jan. 20, 2022

(65) Prior Publication Data

US 2022/0147109 A1 May 12, 2022

Related U.S. Application Data

(63) Continuation of application No. PCT/CN2020/112628, filed on Aug. 31, 2020.

(30) Foreign Application Priority Data

Nov. 21, 2019 (CN) .......................... 201911150374.0

(51) Int. Cl.
*G06F 1/16* (2006.01)
*H10K 59/80* (2023.01)
(52) U.S. Cl.
CPC ......... *G06F 1/1658* (2013.01); *H10K 59/871* (2023.02)
(58) Field of Classification Search
CPC ............ G06F 1/16; H10K 59/87; B65D 81/22
See application file for complete search history.

(56) References Cited

U.S. PATENT DOCUMENTS

| 7,990,061 B2 * | 8/2011 | Kim | H10K 50/8426 313/503 |
| 8,063,561 B2 * | 11/2011 | Choi | H10K 50/8426 313/506 |

(Continued)

FOREIGN PATENT DOCUMENTS

| CN | 200986911 Y | 12/2007 |
| CN | 201029013 Y | 2/2008 |

(Continued)

OTHER PUBLICATIONS

Chinese First Office Action for Application No. 201911150374.0 dated Jan. 28, 2021., 20 pgs.

(Continued)

*Primary Examiner* — Britt D Hanley
(74) *Attorney, Agent, or Firm* — Maier & Maier, PLLC

(57) ABSTRACT

A display panel includes: a first substrate; a second substrate, arranged opposite to the first substrate. A first locking structure is arranged on at least one edge of a surface of the first substrate facing the second substrate, a second locking structure that corresponds to the first locking structure is arranged on a surface of the second substrate facing the first substrate corresponding to the at least one edge. The first locking structure includes a first locking member arranged on the first substrate and a second locking member arranged on the first locking member. The second locking structure includes a third locking member arranged on the second substrate and a fourth locking member arranged on the third locking member. The first locking member is engaged with the third locking member, and the second locking member is engaged with the fourth locking member.

20 Claims, 4 Drawing Sheets

(56) References Cited

U.S. PATENT DOCUMENTS

| | | | | |
|---|---|---|---|---|
| 2003/0042852 A1* | 3/2003 | Chen | ............... | H10K 50/8428 |
| | | | | 313/512 |
| 2003/0107315 A1* | 6/2003 | Chen | ............... | H10K 50/8426 |
| | | | | 313/512 |
| 2006/0119263 A1* | 6/2006 | Chen | ............... | H10K 59/179 |
| | | | | 313/511 |
| 2013/0049580 A1* | 2/2013 | Maindron | ......... | H10K 50/8445 |
| | | | | 313/512 |
| 2016/0351544 A1 | 12/2016 | Machida | | |

FOREIGN PATENT DOCUMENTS

| | | |
|---|---|---|
| CN | 201812117 U | 4/2011 |
| CN | 201946636 U | 8/2011 |
| CN | 102830519 A | 12/2012 |
| CN | 104330925 A | 2/2015 |
| CN | 104393189 A | 3/2015 |
| CN | 104582346 A | 4/2015 |
| CN | 105576148 A | 5/2016 |
| CN | 206061326 U | 3/2017 |
| CN | 106646974 A | 5/2017 |
| CN | 107634150 A | 1/2018 |
| CN | 108428805 A | 8/2018 |
| CN | 109119387 A | 1/2019 |
| CN | 208548107 U | 2/2019 |
| CN | 109471304 A | 3/2019 |
| CN | 109741683 A | 5/2019 |
| CN | 109826299 A | 5/2019 |
| CN | 110109281 A | 8/2019 |
| CN | 110782799 A | 2/2020 |
| CN | 110853572 A | 2/2020 |
| JP | 2017076050 A | 4/2017 |
| KR | 20190025489 A | 3/2019 |
| KR | 20190049972 A | 5/2019 |
| WO | 2019128032 A1 | 7/2019 |

OTHER PUBLICATIONS

Chinese Second Office Action for Application No. 201911150374.0 dated Jul. 22, 2021., 13 pgs.

International Search Report for Application No. PCT/CN2020/112628 dated Dec. 17, 2020., 6 pgs.

Notification to Grant Patent Right for Invention for Application No. 201911150374.0 dated Dec. 3, 2021., 3 pgs.

\* cited by examiner

DISPLAY PANEL AND METHOD FOR MANUFACTURING THE SAME

CROSS REFERENCE TO RELATED APPLICATIONS

The present application is a continuation-application of International (PCT) Patent Application No. PCT/CN2020/112628 filed on Aug. 31, 2020, which claims the foreign priority of the Chinese patent application No. 201911150374.0, filed on Nov. 21, 2019 in the China National Intellectual Property Administration, and the entire contents of which are hereby incorporated by reference in their entireties.

TECHNICAL FIELD

The present disclosure relates to the field of displaying, and particularly to a display panel and a method of manufacturing a display panel.

BACKGROUND

As the display technology continuously develops in recent years, a display panel having a high screen-to-body ratio, a full-screen, and a narrow bezel may be the mainstream of the current market. In the art, the display panel having a hard screen package may use Frit glass powder as a main sealing material, a packaging effect of the display panel and a pulling force of the display panel may be significantly affected by a width and a thickness of the sealing material.

In order to achieve the narrow bezel, packaging by the traditional Frit glass powder may affect reliability and the pulling force of the display panel. Therefore, a packaging form suitable for the narrow bezels need to be achieved.

SUMMARY OF THE DISCLOSURE

The present disclosure provides a display panel and a method for manufacturing the display panel to improve the pulling force of the display panel and allow the display panel to have a narrow bezel.

According to a first aspect, a display panel includes: a first substrate; a second substrate, arranged opposite to the first substrate; wherein a first locking structure is arranged on at least one edge of a surface of the first substrate facing the second substrate, a second locking structure that corresponds to the first locking structure is arranged on a surface of the second substrate facing the first substrate and at a position corresponding to the at least one edge; the first locking structure comprises a first locking member arranged on the first substrate and a second locking member arranged on the first locking member; the second locking structure comprises a third locking member arranged on the second substrate and a fourth locking member arranged on the third locking member; the first locking member is engaged with the third locking member, and the second locking member is engaged with the fourth locking member, such that the first substrate is engaged with the second substrate.

According to another aspect, a method for manufacturing the display panel includes: forming a first locking structure on at least one edge of a first substrate, wherein the first locking structure comprises a first locking member arranged on the first substrate and a second locking member arranged on the first locking member; forming a second locking structure that corresponds to the first locking structure on a surface of a second substrate facing the first substrate and at a position corresponding to the at least one edge, wherein the second locking structure comprises a third locking member arranged on the second substrate and a fourth locking member arranged on the third locking member; aligning the first locking structure to the second locking structure, allowing the first substrate to approach the second substrate along an extension direction of the at least one edge, such that the first substrate is opposite to the second substrate, the first locking member is engaged with the third locking member, and the second locking is engaged with the fourth locking member.

According to the present disclosure, the display panel includes a first substrate and a second substrate that are disposed opposite to each other. A first locking structure may be arranged on at least one edge of the first substrate. A second locking structure that corresponds to the first locking structure may be arranged on a surface of the second substrate facing the first substrate and at a position corresponding to the first locking structure. When the first substrate and the second substrate are engaged, a first locking member of the first locking structure may be engaged with a third locking member of the second locking structure, and a second locking member of the first locking structure may be engaged with a fourth locking member of the second locking structure. Engagement between the above two components may enhance connection strength between the first substrate and the second substrate and may improve the pulling force of the display panel. Compared to the traditional packaging method using the Frit glass powder, the packaging method in the present disclosure may have a smaller width and a higher sealing performance, which may facilitate the narrow bezel to be achieved. In addition, in the present disclosure, the engagement between the first substrate and the second substrate of the display panel may be achieved by sliding leftwards and rightwards, whereas the engagement of the display panel in the art is achieved by clamping up and down. In this way, an alignment accuracy while engaging may be improved, and a design margin for alignment may be reduced.

DETAILED DESCRIPTION

Technical solutions of the embodiments of the present disclosure will be clearly and comprehensively described by referring to the accompanying drawings. Obviously, the embodiments described are only a part of, but not all of, the embodiments of the present disclosure. Based on the embodiments of the present disclosure, all other embodiments obtained by the person of ordinary skill in the art without making creative work shall fall within the scope of the present disclosure.

Figure 1:
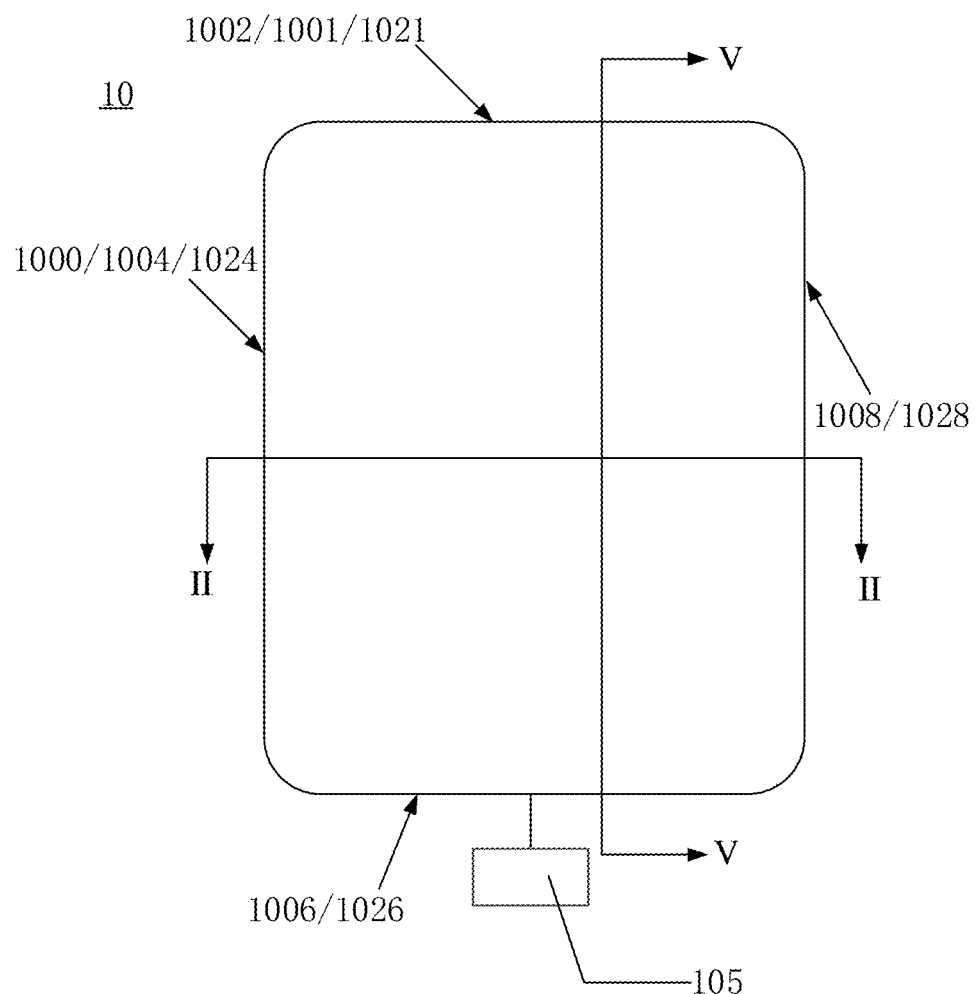
FIG. 1 is a top view of a display panel according to an embodiment of the present disclosure.
Figure 2:
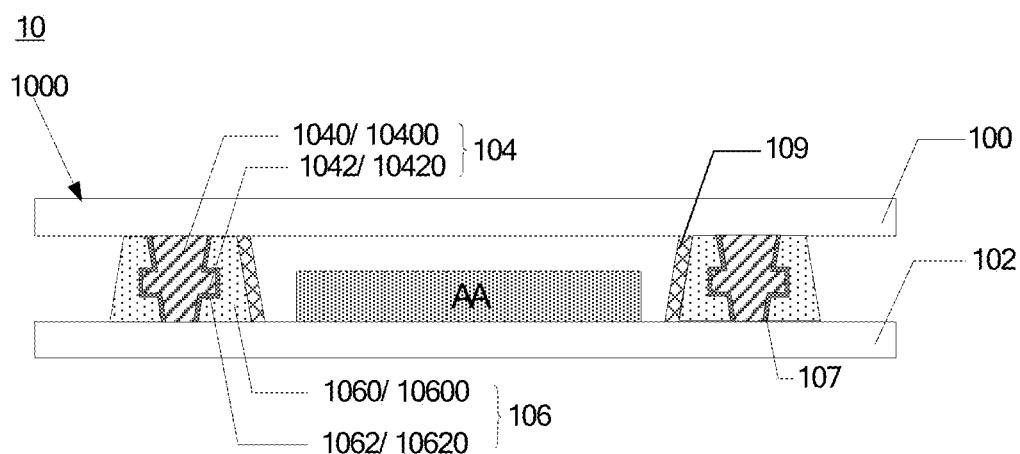
FIG. 2 is a cross section view of the display panel shown in FIG. 1, by taking from the line II-II.

As shown in FIG. 1 and FIG. 2, FIG. 1 is a top view of a display panel according to an embodiment of the present disclosure, and FIG. 2 is a cross section view of the display panel shown in FIG. 1, by taking from the line II-II. The display panel 10 may be an OLED display panel, a micro-LED display panel, and the like. The display panel 10 may include a first substrate 100 and a second substrate 102, the second substrate 102 may be arranged opposite to the first substrate 100. In the present embodiment, the first substrate 100 and the second substrate 102 may be made of glass and the like.

A first locking structure 104 may be arranged on at least one edge 1000 of a surface of the first substrate 100 facing the second substrate 102. A second locking structure 106 that corresponds to the first locking structure 104 may be arranged on a surface of the second substrate 102 facing the first substrate 100 and at a position corresponding to the at least one edge 1000. The first locking structure 104 may include a first locking member 1040 arranged on the first substrate 100 and a second locking member 1042 arranged on the first locking member 1040. The second locking structure 106 may include a third locking member 1060 arranged on the second substrate 102 and a fourth locking member 1062 arranged on the third locking member 1060. The first locking member 1040 may engage with the third locking member 1060, and the second locking member 1042 may engage with the fourth locking member 1062. In this way, the first substrate 100 may engage with the second substrate 102.

Engagement between the above two components (i.e., engagement between the first locking member 1040 and the third locking member 1060, and engagement between the second locking member 1042 and the fourth locking member 1062) may enhance connection strength between the first substrate 100 and the second substrate 102 and improve the pulling force of the display panel 10. Compared to the traditional packaging method using the Frit glass powder, the packaging method in the present disclosure may have a smaller width and a higher sealing performance, which may facilitate the narrow bezel to be achieved. In addition, in the present disclosure, the engagement between the first substrate and the second substrate of the display panel may be achieved by sliding leftwards and rightwards, whereas the engagement of the display panel in the art is achieved by clamping up and down. In this way, an alignment accuracy while engaging the substrates may be improved, and a design margin for alignment may be reduced. A detailed substrate engagement process will be illustrated in the following method operations.

In an embodiment, as shown in FIG. 2, the first locking member 1040 may include a first protrusion 10400 arranged on the first substrate 100, and the second locking member 1042 may include at least one bump 10420 arranged on a side wall of the first protrusion 10400. A cross section of the above-mentioned first protrusion 10400 taken along the line II-II may be trapezoidal, rectangular, and the like, and a cross section of the bump 10420 may be trapezoidal and the like. The third locking member 1060 may include a second protrusion 10600 arranged on the second substrate 102 and define a through hole (not shown). A cross section of the above-mentioned second protrusion 10600 taken along the line II-II may be trapezoidal, rectangular, and the like. The through hole may extend from a surface of the second protrusion 10600 near the second substrate 102 to a surface of the second protrusion 10600 near the first substrate 100. In this way, the through hole may correspond to the first locking member 1040, such that the first locking member 1040 may be engaged with the third locking member 1060. The fourth locking member 1062 may include a concave portion 10620 disposed on an inner wall of the second protrusion 10600, and the inner wall is formed along a wall of the through hole. A cross section of the above-mentioned concave portion 10620 taken along the line II-II may be trapezoidal and the like. The concave portion 10620 may correspond to the second locking member 1042, such that the second locking member 1042 may be engaged with the fourth locking member 1062. In the above embodiment, the structure to achieve the engagement between the first locking member 1040 and the third locking member 1060 and the engagement between the second locking member 1042 and the fourth locking member 1062 may be relatively simple and may be easily implemented, and the engaging effect may be ideal.

Figure 3:
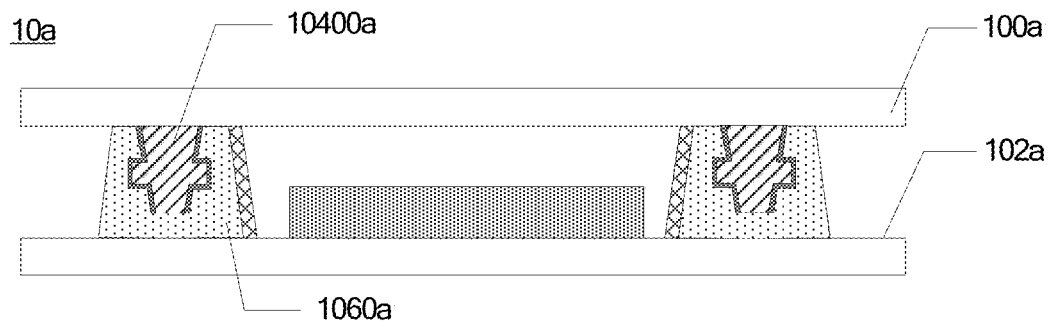
FIG. 3 is a cross section view of the display panel shown in FIG. 1 according to another embodiment of the present disclosure.

The above-mentioned first locking structure 104 and second locking structure 106 may have other structures, which will not be limited by the present disclosure. For example, as shown in FIG. 3, FIG. 3 is a cross section view of the display panel shown in FIG. 1 according to another embodiment of the present disclosure. In the present embodiment, the third locking member 1060a may define a recess, whereas the recess does not extend through the two surfaces of the second protrusion, and an end portion of the first protrusion 10400a may contact a bottom wall of the recess. Further, in order to increase the pulling force of the display panel 10a, a post may be configured on the end portion of the first protrusion 10400a, and the bottom wall of the recess may define a slot for receiving the post. Alternatively, an adhesive layer and the like may be configured between the end portion of the first protrusion 10400a and the bottom wall of the recess for connection.

In addition, only one bump 10420 is schematically shown on the side wall of the first protrusion 10400 in FIG. 2, and in other embodiments, a plurality of bumps 10420 may be configured on the side wall of the first protrusion 10400. Correspondingly, the second protrusion 10600 may define a plurality of through holes, and the concave portion 10620 may be disposed on the inner wall of each of the plurality of through holes, i.e., a plurality of concave portions 10620 may be disposed. By engaging the plurality of bumps 10420 with the plurality of concave portions 10620, the engaging effect may be improved, and thus improving the pulling force of the display panel 10.

Further, in the present embodiment, the first protrusion 10400 can be formed by the surface of the first substrate 100 protruding, i.e., the first protrusion 10400 and the first substrate 100 may be an integral and overall component, and in this way, connection between the first protrusion 10400 and the first substrate 100 may be strong, and a probability of the first protrusion 10400 being detached from the first substrate 100 may be reduced, such that the pulling force of the display panel 10 may further be improved. Similarly, the second protrusion 10600 may be formed by the surface of the second substrate 102 protruding, i.e., the second protrusion 10600 and the second substrate 102 may be an integral and overall component, and in this way, connection between the second protrusion 10600 and second first substrate 102 may be strong, and a probability of the second protrusion 10600 being detached from the second substrate 102 may be reduced, such that the pulling force of the display panel 10 may further be improved.

Figure 4:
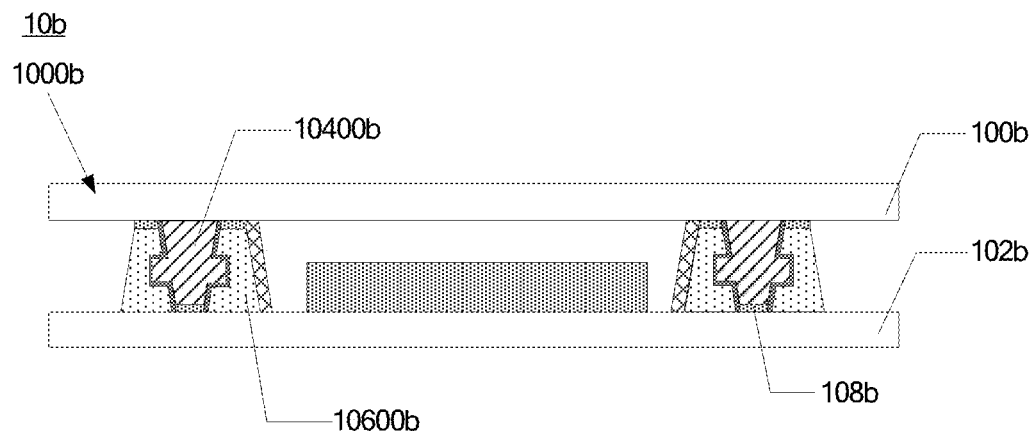
FIG. 4 is a cross section view of the display panel shown in FIG. 1 according to still another embodiment of the present disclosure.

In another embodiment, as shown in FIG. 2, an end portion of the first protrusion 10400 away from the first substrate 100 may contact the second substrate 102, and/or, an end portion of the second protrusion 10600 away from the second substrate 102 may contact the first substrate 100. In this way, a contact area between the first protrusion 10400 and the second protrusion 10600 may be relatively large, such that the pulling force of the display panel 10 may be improved. In other embodiments, as shown in FIG. 4, FIG. 4 is a cross section view of the display panel shown in FIG. 1 according to still another embodiment of the present disclosure. A gap (not shown) may be defined between the end portion of the first protrusion 10400b away from the first substrate 100b and the second substrate 102b. To improve the pulling force of the display panel 10b and the sealing performance, an encapsulation material 108b, such as hot-melt sealing material resin and the like, may be received in the gap.

Figure 5:
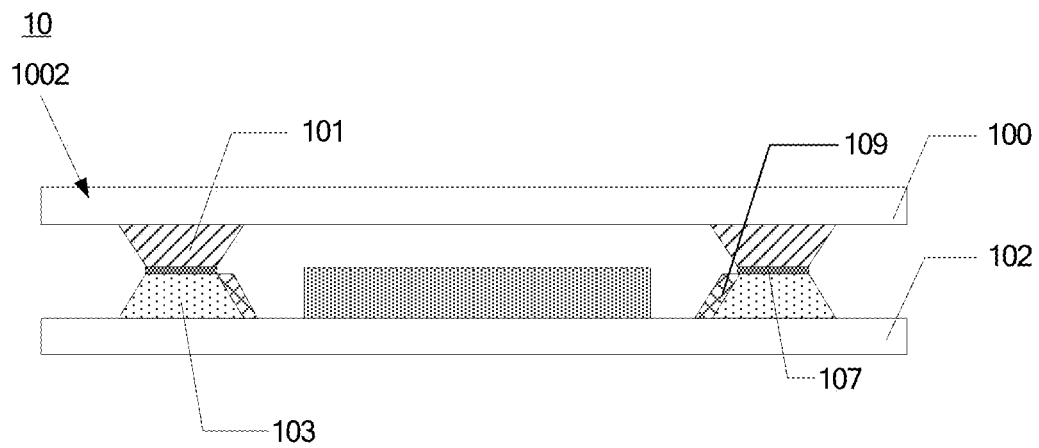
FIG. 5 is a cross section view of the display panel shown in FIG. 1, by taking from the line V-V.

In another embodiment, as shown in FIG. 1 and FIG. 5, FIG. 5 is a cross section view of the display panel shown in FIG. 1, by taking from the line V-V. A first boss 101 may be arranged on at least one other edge 1002 of the surface of the first substrate 100 facing the surface of the second substrate 102. A second boss 103 that corresponds to the first boss 101 may be arranged on the surface of the second substrate 102 facing the first substrate 100 and at a position corresponding to the at least one other edge 1002. The first boss 101 may abut against the second boss 103. By arranging the first boss 101 and the second boss 103, the first substrate 100 and the second substrate 102 may be better leveled. Compared to the traditional packaging method in the art using the Frit glass powder, the packaging method in the present disclosure may have a smaller width and a better sealing performance, such that the display panel may have a narrow bezel.

In the present embodiment, the first boss 101 may be formed by the surface of the first substrate 100 protruding, i.e., the first boss 101 and the first substrate 100 may be an integral and overall structure, and in this way, connection between the first boss 101 and the first substrate 100 may be strong, and a probability of the first boss 101 being detached from the first substrate 100 may be reduced, such that the pulling force of the display panel 10 may be improved. Similarly, the second boss 103 may be formed by the surface of the second substrate 102 protruding, i.e., the second boss 103 and the second substrate 102 may be an integral and overall structure, and in this way, connection between the second boss 103 and the second substrate 102 may be strong, and a probability of the second boss 103 being detached from the second substrate 102 may be reduced, such that the pulling force of the display panel 10 may be improved.

In an application, as shown in FIG. 2 and FIG. 5, a height of the first protrusion 10400 may be equal to a height of the second protrusion 10600, a height of the first boss 101 may be equal to a height of the second boss 103, and the height of the first protrusion 10400 may be greater than the height of the first boss 101. In this way, a process of forming the first protrusion 10400, the second protrusion 10600, the first boss 101 and the second boss 103 may be relatively simple and easier to be controlled. Further, in the present embodiment, as shown in FIG. 2, the height of the first protrusion 10400 may be equal to a distance between the first substrate 100 and the second substrate 102, and the height of the first protrusion 10400 may be twice of the height of the first boss 101. More specifically, the height of the first protrusion 10400 may be equal to a distance between the surface of the first substrate 100 facing the second substrate 102 and the surface of the second substrate 102 facing the first substrate 100.

Figure 6:
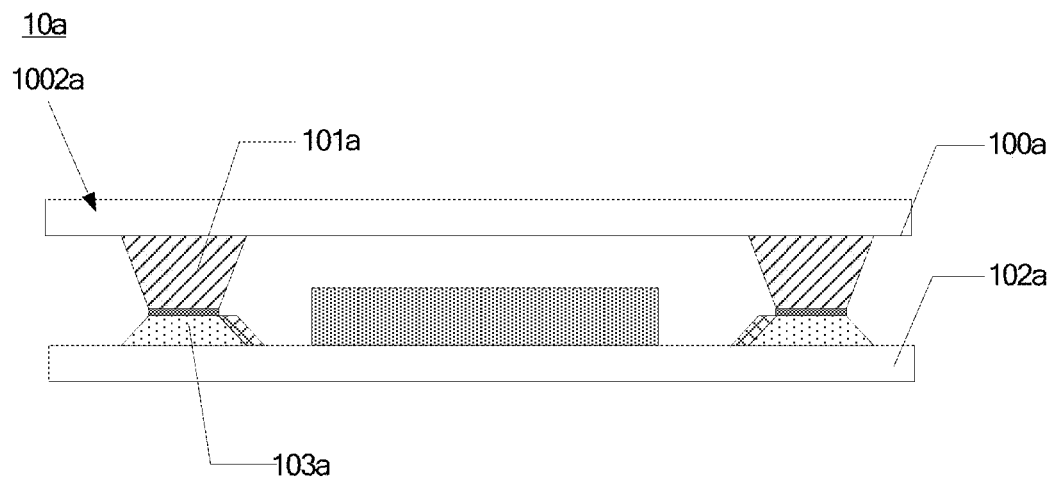
FIG. 6 is a cross section view of the display panel shown in FIG. 1 according to another embodiment of the present disclosure.

In another application, the heights of the above-mentioned protrusions and the bosses may be changed when the first locking structure 104 and the second locking structure 106 are configured by other means. For example, as shown in FIG. 3 and FIG. 6, FIG. 6 is a cross section view of the display panel shown in FIG. 1 according to another embodiment of the present disclosure. In the present embodiment, the height of the first protrusion 10400a disposed on the first substrate 100a may be equal to the height of the first boss 101a disposed on the first substrate 100a, the height of the second protrusion 10600a disposed on the second substrate 103a may be unequal to the height of the second boss 103a disposed on the second substrate 102a, and the height of the second protrusion 10600a may be greater than the height of the second boss 103a. In this way, a process of forming the first protrusion 10400a, the second protrusion 10600a, the first boss 101a and the second boss 103a may be simple and easier to be controlled. Further, in the present embodiment, the height of the second protrusion 10600a may be equal to the distance between the first substrate 100a and the second substrate 102a, and the height of the second protrusion 10600a may be equal to a sum of the height of the first boss 101a and the height of the second boss 103a. More specifically, the height of the second protrusion 10600a may be equal to the distance between the surface of the first substrate 100a facing the second substrate 102a and the surface of the second substrate 102a facing the first substrate 100a.

Figure 7:
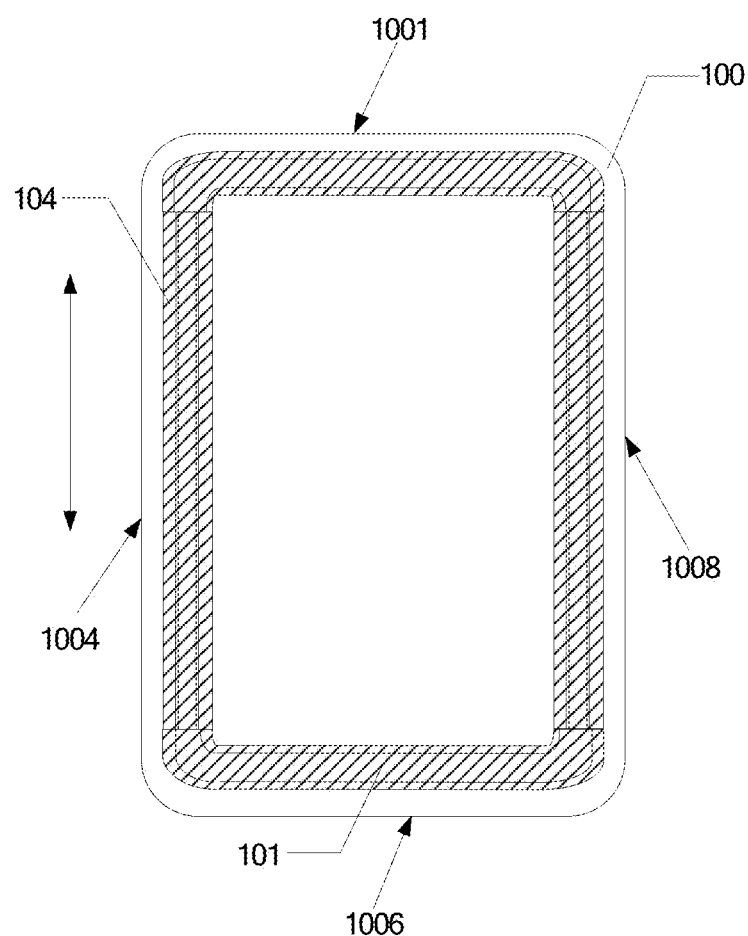
FIG. 7 is a top view of a first substrate, a first locking structure, and a first boss of the display panel shown in FIG. 1 according to an embodiment of the present disclosure.
Figure 8:
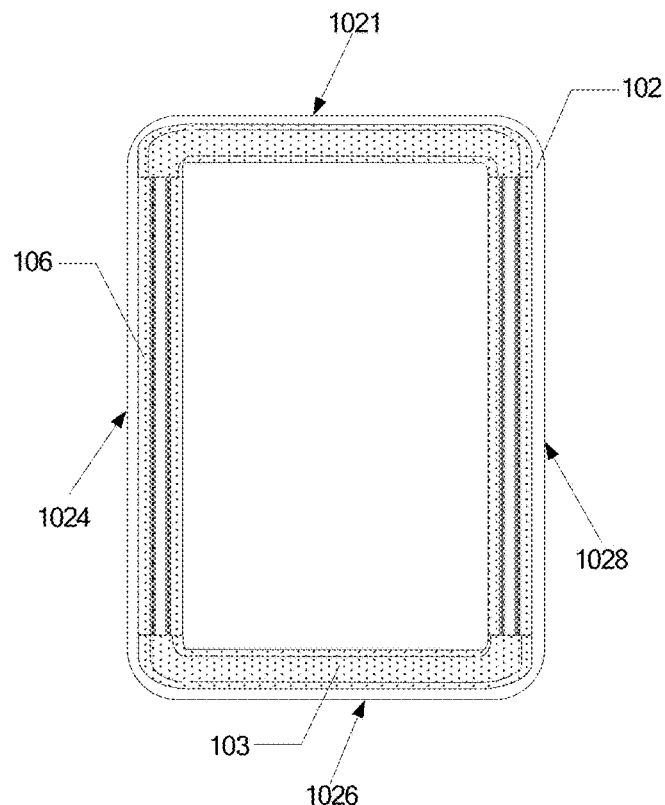
FIG. 8 is a top view of a second substrate, a second locking structure, and a second boss of the display panel shown in FIG. 1 according to an embodiment of the present disclosure.
Figure 9:
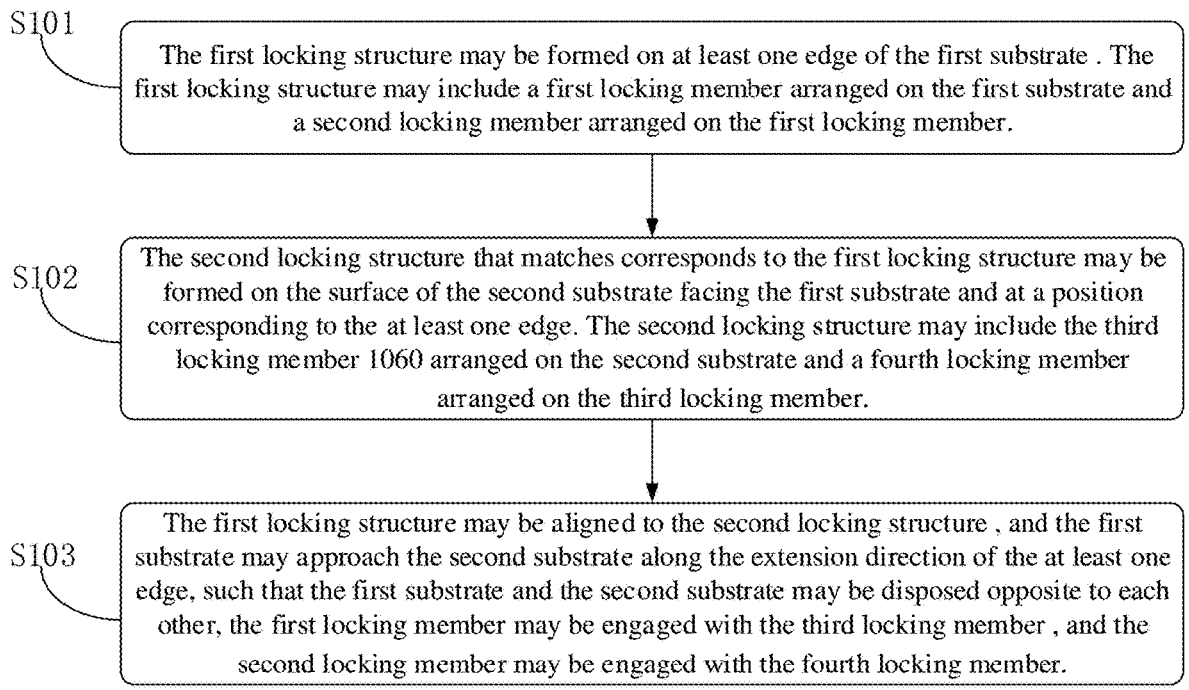
FIG. 9 is a flow chart of a method of manufacturing a display panel according to an embodiment of the present disclosure.

In another application, as shown in FIG. 7 and FIG. 8, FIG. 7 is a top view of a first substrate, a first locking structure, and a first boss of the display panel shown in FIG. 1 according to an embodiment of the present disclosure, and FIG. 8 is a top view of a second substrate, a second locking structure, and a second boss of the display panel shown in FIG. 1 according to an embodiment of the present disclosure. The surface of the first substrate 100 facing the second substrate 102 may include a first edge 1004, a second edge 1006, a third edge 1008, and a fourth edge 1001. The surface of the second substrate 102 facing the first substrate 100 may include a first edge 1024, a second edge 1026, a third edge 1028, and a fourth edge 1021, correspondingly. The first edge 1004/1024 may be opposite to the third edge 1008/1028, the second edge 1006/1026 may be opposite to the fourth edge 1001/1021, the first edge 1004/1024 may be adjacent to the second edge 1006/1026 and the fourth edge 1001/1021, and the third edge 1008/1028 may be adjacent to the second edge 1006/1026 and the fourth edge 1001/1021. The first locking structure 104 may be arranged on at least one of the first edge 1004 and the opposite third edge 1008 of the first substrate 100. The second locking structure 106 may be arranged on at least one of the first edge 1024 and the third edge 1028 of the second substrate 102, and the second locking structure 106 may be arranged to correspond to the position of the first locking structure 104. The first boss 101 may be arranged on at least one of the second edge 1006 and the opposite fourth edge 1001 of the first substrate 100. The second boss 103 may be arranged on at least one of the second boundary 1026 and the fourth boundary 1021 of the second substrate 102, correspondingly. In this way, the display panel 10 may have a relatively simple structure, enabling the substrates to be engaged easily at a later stage.

In the present embodiment, the first locking structure 104 may be arranged on each of the first edge 1004 and the third edge 1008 of the first substrate 100, and the first boss 101 may be arranged on each of the second edge 1006 and the fourth edge 1001 of the first substrate 100. As shown in FIG. 1, the display panel 10 may further include a chip 105, and the chip 105 may be disposed on a side of the second edge 1006 or the fourth edge 1001. When assembling the first substrate 100 with the second substrate 102, the first locking structure 104 and the second locking structure 106 may serve as guiding rails. The first substrate 100 may slide to approach the second substrate 102 along an extension direction of the first edge 1004 or the third edge 1008 until the first substrate 100 is completely engaged with the second substrate 102. The above-mentioned display panel 10 has a higher pulling force, engagement between the first substrate 100 and the second substrate 102 may be achieved by sliding leftwards and rightwards instead of performing a traditional up-and-down snapping operation, and an engagement accuracy may be high. In addition, configuring the chip 105 on the side of the second edge 1006 or the fourth edge 1001, an impact on the chip 105 while engaging the first and the second substrates may be reduced.

Further, as shown in FIG. 7 and FIG. 8, a connective portion between adjacent edges of the first substrate 100 may be curved. The first boss 101 may further be configured in the curved area. A connective portion between adjacent edges of the second substrate 102 may be curved. The second boss 103 may further be configured in the curved area. In this way, the engagement between the first substrate 100 and the second substrate 102 may be smoother.

In addition, as shown in FIG. 7 and FIG. 8, when the height of the first boss 101 is less than the height of the first locking structure 104, and the height of the second boss 103 is less than the height of the second locking structure 106, an abutting region may be present between the first locking structure 104 and the first boss 101 that are arranged on adjacent edges of the first substrate, and an abutting region may be present between the second locking structure 106 and the second boss 103 that are arranged on adjacent edges of the second substrate. In this way, the first locking structure 104 and the first boss 101 may form a ring to improve the packaging performance of the display panel 10.

In still another embodiment, as shown in FIG. 2 and FIG. 5, in order to improve anti-oxidant performance, water-proof performance, and the pulling force of the display panel 10, the display panel 10 may further include: a packaging material layer 107, disposed in a contact area between the first boss 101 and the second boss 103 and in a contact area between the first locking structure 104 and the second locking structure 106. The above packaging material layer 107 may be hot melt sealing material resin and the like. In other embodiments, the packaging material layer 107 may be omitted, the first boss 101 may be sintered to the second boss 103, and the first locking structure 104 may be sintered to the second locking structure 106.

In still another embodiment, as shown in FIG. 2 and FIG. 5, the first boss 101 and/or the second boss 103 and/or the first protrusion 10400 and/or the second protrusion 10600 may include an exposed area (not labeled) that faces a display area AA (not labeled) of the display panel 10. The display panel 10 may further include a drying layer 109. The drying layer 109 covering at least part of the exposed area. A material of the drying layer 109 may be a water-absorbent material such as polyvinyl alcohol, and the drying layer may be formed by coating the material. The drying layer 109 may further block water and oxygen. The above-mentioned exposed area may refer to an area that is in direct contact with the display area and is not blocked by any adjacent structure. In the present embodiment, the drying layer 109 may be disposed on a surface of the second protrusion 10600 of the second substrate 102 facing the display area AA and a surface of the second boss 103 of the second substrate 102 facing the display area AA. In this way, a manufacturing process may be easier, and complexity of the manufacturing process may be reduced.

As shown in FIGS. 2, 5, 7, 8, and 9, FIG. 9 is a flow chart of a method of manufacturing a display panel according to an embodiment of the present disclosure. The method for manufacturing the display panel may include following operations.

In an operation S101, the first locking structure 104 may be formed on at least one edge of the first substrate 100. The first locking structure 104 may include a first locking member 1040 arranged on the first substrate 100 and a second locking member 1042 arranged on the first locking member 1040.

In detail, in the present embodiment, the first locking member 1040 may include the first protrusion 10400 arranged on the first substrate 100, and the second locking member 1042 may include at least one bump 10420 arranged on the side wall of the first protrusion 10400. The above operation S101 may specifically include: growing the at least one edge of the first substrate 100 to form the first protrusion 10400; and performing a laser etching process or applying etching solution on the side wall of the first protrusion 10400 to form the at least one bump 10420 on the side wall of the first protrusion 10400.

In an operation S102, the second locking structure 106 that corresponds to the first locking structure 104 may be formed on the surface of the second substrate 102 facing the first substrate 100 and at a position corresponding to the at least one edge. The second locking structure 106 may include the third locking member 1060 arranged on the second substrate 102 and a fourth locking member 1062 arranged on the third locking member 1060.

In detail, in the present embodiment, the third locking member 1060 may include the second protrusion 10600 arranged on the second substrate 102, and the second substrate 102 may define a through hole. The through hole may extend from the surface of the second protrusion 10600 near the second substrate 102 to the surface of the second protrusion 10600 near the first substrate 100. The fourth locking member 1062 may include the concave portion 10620 arranged on the second protrusion 10600 and extending along the inner wall of the through hole. The operation S102 may specifically include: growing the at least one edge of the second substrate 102 to form the second protrusion 10600; and performing the laser etching process or applying etching solution on the second protrusion 10600 to define the through hole and to form the concave portion 10620 on the inner wall of the through hole. Alternatively, the at least one edge of the second substrate 102 may be grown to form two second sub-protrusions that are spaced apart from each other. A gap between the two second sub-protrusions may serve as the through hole. Subsequently, the laser etching process may be performed or the etching solution may be applied on an inner wall of the second sub-protrusion to form the concave portion 10620.

In an operation S103, the first locking structure 104 may be aligned to the second locking structure 106, and the first substrate 100 may approach the second substrate 102 along the extension direction of the at least one edge (i.e., the direction shown by the bidirectional arrows in FIG. 7), such that the first substrate 100 and the second substrate 102 may be disposed opposite to each other, the first locking member 1040 may be engaged with the third locking member 1060, and the second locking member 1042 may be engaged with the fourth locking member 1062.

In an embodiment, before the operation S103, the method of manufacturing the display panel provided by the present disclosure may further include: disposing the packaging material layer 107 on a contact area between the first locking structure 104 and the second locking structure 106. As the first locking structure 104 and the second locking structure 106 are formed by performing the laser etching operation or applying etching solution, surfaces of the first locking structure 104 and the second locking structure 106 may be relatively rough, and packaging material layer 107 may contact the first locking structure 104 and the second locking structure 106 more tightly.

Further, when the first substrate 100 has a first boss 101 and the second substrate 102 has a second boss 103, the packaging material layer 107 may be arranged at the location where the first boss 101 and the second boss 103 contact each other. After the operation S103, the packaging method provided in the present disclosure may further include: applying UV light to melt the packaging material layer 107 and re-solidifying the packaging material layer 107, such that connection between the first substrate 100 and the second substrate 102 may be more tight.

In another embodiment, before the operation S103, the method of manufacturing the display panel provided in the present disclosure may further include: coating a drying layer 109 on a side of the second boss 103 of the second substrate 102 facing the display area AA of the display panel 10 and on a side of the second protrusion 10600 of the second substrate 102 facing the display area AA of the display panel 10.

The above description shows only implementations of the present disclosure, but does not to limit the scope of the present disclosure. Any equivalent structure or equivalent process transformation based on the specification and the accompanying drawings of the present disclosure, directly or indirectly applied in other related arts, shall be included in the scope of the present disclosure.

What is claimed is:

1. A display panel, comprising:
a first substrate;
a second substrate, arranged opposite to the first substrate;
wherein a first locking structure is arranged on at least one edge of a surface of the first substrate facing the second substrate, a second locking structure corresponding to the first locking structure is arranged on a surface of the second substrate facing the first substrate and at a position corresponding to the at least one edge;
the first locking structure comprises a first locking member arranged on the first substrate and a second locking member arranged on the first locking member;
the second locking structure comprises a third locking member arranged on the second substrate and a fourth locking member arranged on the third locking member;
the first locking member is engaged with the third locking member, and the second locking member is engaged with the fourth locking member, to make the first substrate engaged with the second substrate.

2. The display panel according to claim 1, wherein
the first locking member comprises a first protrusion arranged on the first substrate, the second locking member comprises at least one bump arranged on a side wall of the first protrusion;
third locking member comprises a second protrusion arranged on the second substrate, and the second substrate defines a through hole;
the through hole extends from a surface of the second protrusion adjacent to the second substrate to a surface of the second protrusion near the first substrate, the through hole corresponds to the first locking member, to make the first locking member engaged with the third locking member;
the fourth locking member comprises a concave portion disposed on an inner wall of the second protrusion, the inner wall is formed along a wall of the through hole, the concave portion corresponds to the second locking member, such that the second locking member is engaged with the fourth locking member.

3. The display panel according to claim 2, wherein
a first boss is arranged on at least one edge of the surface of the first substrate facing the surface of the second substrate;
a second boss corresponding to the first boss is arranged on the surface of the second substrate facing the first substrate and at a position corresponding to the at least one other edge; and
the first boss abuts against the second boss.

4. The display panel according to claim 3, wherein
a height of the first protrusion is equal to a height of the second protrusion, a height of the first boss is equal to a height of the second boss, and the height of the first protrusion is greater than the height of the first boss.

5. The display panel according to claim 4, wherein
the height of the first protrusion is equal to a distance between the first substrate and the second substrate, and the height of the first protrusion is twice the height of the first boss.

6. The display panel according to claim 3, wherein
a height of the first protrusion disposed on the first substrate is equal to a height of the first boss disposed on the first substrate, a height of the second protrusion disposed on the second substrate is unequal to a height of the second boss disposed on the second substrate, and the height of the second protrusion is greater than the height of the second boss.

7. The display panel according to claim 3, wherein the first protrusion, the first boss, and the first substrate is an integral and overall structure, and the second protrusion, the second boss, and the second substrate is an integral and overall structure.

8. The display panel according to claim 3, wherein
the surface of the first substrate facing the second substrate comprises a first edge of the first substrate, a second edge of the first substrate, a third edge of the first substrate, and a fourth edge of the first substrate;
the surface of the second substrate facing the first substrate comprises a first edge of the second substrate corresponding to the first edge of the first substrate, a second edge of the second substrate corresponding to the second edge of the first substrate, a third edge of the second substrate corresponding to the third edge of the first substrate, and a fourth edge of the second substrate corresponding to the fourth edge of the first substrate;
the first edge of the first substrate is opposite to the third edge of the first substrate, the second edge of the first substrate is opposite to the fourth edge of the first substrate, the first edge of the first substrate is adjacent to the second edge and the fourth edge of the first substrate, and the third edge of the first substrate is adjacent to the second edge and the fourth edge of the first substrate;

the first locking structure is arranged on at least one of the first edge of the first substrate and the third edge of the first substrate opposite to the first edge of the first substrate;

the second locking structure is arranged on at least one of the first edge and the third edge of the second substrate, and the second locking structure is arranged to correspond to the position of the first locking structure;

the first edge of the second substrate is opposite to the third edge of the second substrate, the second edge of the second substrate is opposite to the fourth edge of the second substrate, the first edge of the second substrate is adjacent to the second edge and the fourth edge of the second substrate, and the third edge of the second substrate is adjacent to the second edge and the fourth edge of the second substrate, the second boss is arranged on at least one of the second edge and the fourth edge of the second substrate.

9. The display panel according to claim 8, wherein the first locking structure is arranged on each of the first edge and the third edge of the first substrate, and the first boss is arranged on each of the second edge and the fourth edge of the first substrate; and
the display panel further comprises a chip, and the chip is disposed on a side of the second edge or a side of the fourth edge.

10. The display panel according to claim 8, wherein a connective portion between adjacent edges of the first substrate is curved, the first boss is further configured on the curved connective portion of the first substrate; and
a connective portion between adjacent edges of the second substrate is curved, the second boss is further configured on the curved connective portion of the second substrate.

11. The display panel according to claim 10, wherein the first locking structure and the first boss having an abutting region are formed on adjacent edges thereof, the second locking structure and the second boss having another abutting region are formed on adjacent edges thereof, and the first locking structure and the first boss are configured to form a ring, the second locking structure and the second boss are configured to form a ring.

12. The display panel according to claim 3, further comprising a packaging material layer, disposed in a contact area between the first boss and the second boss and in another contact area between the first locking structure and the second locking structure.

13. The display panel according to claim 3, further comprising a drying layer, covering the second protrusion and a side of the second boss close to a display area of the display panel.

14. The display panel according to claim 1, wherein the first locking member comprises a first protrusion arranged on the first substrate, and the second locking member comprises at least one bump arranged on a side wall of the first protrusion;
the third locking member comprises a second protrusion arranged on the second substrate, and the second substrate defines a recess;

the recess extends from a surface of the second protrusion close to the first substrate to a surface of the second protrusion close to the second substrate, the recess is defined to correspond to the first locking member, to make the first locking member engaged with the third locking member;

the fourth locking member comprises a concave portion disposed on an inner wall of the second protrusion, the inner wall is formed along a wall of the through hole, the concave portion corresponds to the second locking member, making the second locking member engaged with the fourth locking member.

15. The display panel according to claim 14, wherein the first protrusion has an end portion, the end portion contacts a bottom wall of the recess;
a post is configured on the end portion of the first protrusion, and the bottom wall of the recess defines a slot for receiving the post.

16. The display panel according to claim 14, wherein the first protrusion has an end portion, the end portion contacts a bottom wall of the recess; and
an adhesive layer is configured between the end portion of the first protrusion and the bottom wall of the recess.

17. A substrate assembly for a display panel, comprising:
a first substrate;
a second substrate, arranged opposite to the first substrate;
a first locking structure, arranged on at least one edge of a surface of the first substrate facing the second substrate, wherein the first locking structure comprises:
a first locking member, protruding from the surface of the first substrate facing the second substrate; and
a second locking member, arranged on a side wall of the first locking member;
a second locking structure, arranged on at least one edge of a surface of the second substrate facing the first substrate and arranged at a position corresponding to the first locking structure, wherein the second locking structure comprises:
a third locking member, protruding from the surface of the second substrate facing the first substrate and defining a through hole;
wherein an inner wall of the through hole defines a recess, the first locking member is received in the through hole, and the second locking member is received in the recess, allowing the first locking structure to be engaged with the second locking structure.

18. The substrate assembly according to claim 17, wherein the through hole extends from the surface of the second substrate facing the first substrate to a surface of the second substrate away from the first substrate.

19. The substrate assembly according to claim 18, wherein,
a first boss is arranged on the at least one edge of the surface of the first substrate facing the surface of the second substrate;
a second boss that corresponds to the first boss is arranged on the surface of the second substrate facing the first substrate and at a position corresponding to the at least one other edge; and
the first boss abuts against the second boss.

20. The substrate assembly according to claim 19, wherein,
a connective portion between adjacent edges of the first substrate is curved, the first boss is further configured on the curved connective portion of the first substrate; and a connective portion between adjacent edges of the second substrate is curved, the second boss is further configured on the curved connective portion of the second substrate.

\* \* \* \* \*